United States Patent
Trinks

(10) Patent No.: US 8,914,971 B2
(45) Date of Patent: Dec. 23, 2014

(54) METHOD AND APPARATUS FOR THE PLACEMENT OF ELECTRONIC COMPONENTS, IN PARTICULAR SEMI CONDUCTOR CHIPS ON A SUBSTRATE

(75) Inventor: Joachim Trinks, Flawil (CH)

(73) Assignee: Kulicke & Soffa Die Bonding GmbH, Berg (CH)

( * ) Notice: Subject to any disclaimer, the term of this patent is extended or adjusted under 35 U.S.C. 154(b) by 313 days.

(21) Appl. No.: 12/226,194

(22) PCT Filed: Apr. 12, 2006

(86) PCT No.: PCT/EP2006/061544
§ 371 (c)(1),
(2), (4) Date: Oct. 10, 2008

(87) PCT Pub. No.: WO2007/118511
PCT Pub. Date: Oct. 25, 2007

(65) Prior Publication Data
US 2009/0269178 A1  Oct. 29, 2009

(51) Int. Cl.
*B23P 19/00* (2006.01)
*H05K 3/30* (2006.01)
*H01L 21/67* (2006.01)

(52) U.S. Cl.
CPC .... *H01L 21/67144* (2013.01); *H01L 21/67132* (2013.01)
USPC .................... 29/739; 29/740; 29/832; 29/834

(58) Field of Classification Search
USPC .................................... 29/739, 740, 832, 834
See application file for complete search history.

(56) References Cited

U.S. PATENT DOCUMENTS

| | | | | |
|---|---|---|---|---|
| 4,526,646 A | * | 7/1985 | Suzuki et al. | 156/361 |
| 4,653,664 A | * | 3/1987 | Hineno et al. | 221/3 |
| 5,060,366 A | * | 10/1991 | Asai et al. | 29/739 |

(Continued)

FOREIGN PATENT DOCUMENTS

| | | |
|---|---|---|
| JP | 60-16433 | 1/1985 |
| JP | 03-29334 | 2/1991 |

(Continued)

*Primary Examiner* — David Angwin
(74) *Attorney, Agent, or Firm* — Stradley Ronon Stevens & Young, LLP

(57) ABSTRACT

An apparatus for the placement of a semiconductor chip on a substrate is provided. The apparatus includes: (a) a supply station adapted to include a semiconductor wafer in a substantially horizontal position, the semiconductor wafer including the semiconductor chip; (b) a placement station positioned entirely above the supply station, the placement station being adapted to support the substrate; and (c) a transport apparatus entirely above the supply station, the transport apparatus moving the semiconductor chip from the semiconductor wafer to the substrate, the transport apparatus including (1) a pivoting pick-up tool that removes the semiconductor chip from the semiconductor wafer, the pivoting pick-up tool being arranged on a rotary arm, the rotary arm rotates about a horizontal axis to raise the semiconductor chip to a transfer position entirely above the semiconductor wafer through an ascending curved movement, (2) a placement tool that moves the semiconductor chip to the placement station and bonds the semiconductor chip on the substrate at the placement station, and (3) at least one pivoting transfer tool that transfers the semiconductor chip from the pivoting pick-up tool to the placement tool, each of the at least one pivoting transfer tool being arranged on a respective rotary arm to rotate about a respective horizontal axis to raise the semiconductor chip along a respective ascending curved movement.

20 Claims, 12 Drawing Sheets

(56) References Cited

U.S. PATENT DOCUMENTS

Figure 1:
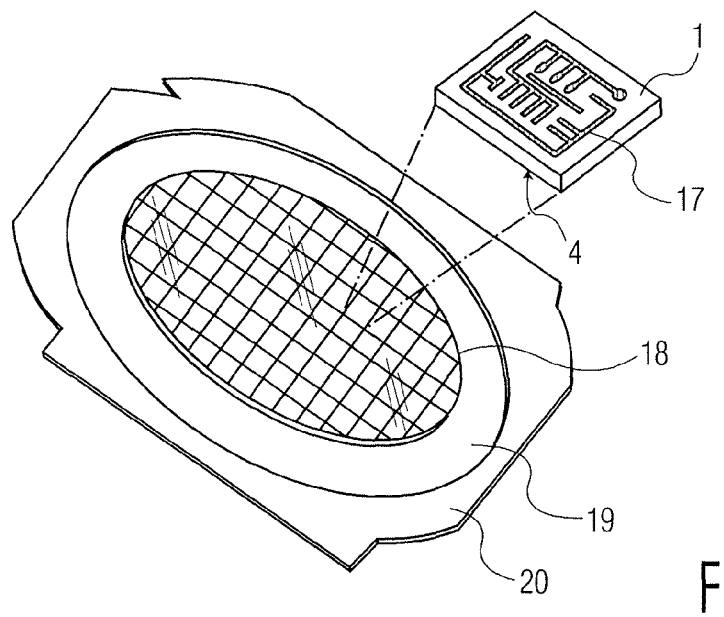

| | | | |
|---|---|---|---|
| 6,171,049 B1 * | 1/2001 | Wirz et al. | 414/680 |
| 6,361,648 B1 * | 3/2002 | Tobin | 156/345.1 |
| 6,621,157 B1 * | 9/2003 | Wirz et al. | 257/692 |
| 6,931,717 B2 * | 8/2005 | Mizuno et al. | 29/740 |
| 6,981,312 B2 * | 1/2006 | Rezaei | 29/740 |
| 7,120,995 B2 * | 10/2006 | Vischer | 29/740 |

FOREIGN PATENT DOCUMENTS

| | | |
|---|---|---|
| TW | 485085 | 5/2002 |
| WO | 97/32460 | 9/1997 |
| WO | 03/065783 | 8/2003 |

* cited by examiner

METHOD AND APPARATUS FOR THE PLACEMENT OF ELECTRONIC COMPONENTS, IN PARTICULAR SEMI CONDUCTOR CHIPS ON A SUBSTRATE

The invention relates to a method for the placement of electronic components, in particular semiconductor chips, in accordance with the preamble of claim 1. By means of a method of this type for example during the production of semiconductor components, in automatic chip mounting machines (die bonders), the unpackaged chip is picked from the already subdivided silicon wafer and then placed or bonded onto corresponding substrates. The bonding process is followed by further process steps such as e.g. curing, wire bonding, melting of soldering connections, encapsulation, singulation, etc.

For positioning the chip on the substrate there are a multiplicity of different processes such as e.g. adhesive bonding, soldering or lamination. The type of connecting process also determines whether the chip does have to be turned (flip-chip applications) or does not have to be turned (non-flip applications) prior to positioning. Turning of the chip is understood hereinafter expressly not to mean a relative movement with respect to a spatial axis or spatial plane, but rather turning with regard to the original bearing side. In the case of non-flip applications, the chip is not turned, and after the pick-up it is transported from the wafer film to the substrate directly in one step, the pick-up tool also simultaneously being used as a bonding tool. The bearing side by which the chip was adhesively bonded on the wafer film is then also the side by which the chip is adhesively bonded onto the substrate. A known apparatus of this type has been mentioned for example in EP 1 049 140 or disclosed by the applicant's company magazine "Newsline 1/2002"(machine type "Easyline"). In the case of flip-chip applications, the chip is deposited onto the substrate by its structure side after turning, that is to say that the bearing side by which the chip was adhesively bonded on the wafer film is, after positioning, then the side remote from the substrate. Ever greater requirements are made of modern die bonder systems with regard to production costs, throughput, accuracy and process flexibility. The machines should nevertheless not exceed existing apparatuses with regard to structural height, machine layout plan, weight, etc. This leads to an ever greater complexity of the machines with regard to mechanics, movement sequences and control. US 2005/0132567 has disclosed an apparatus in which semiconductor chips are picked up by a rotatable pick tool having three tool heads and are transported from there to a higher plane and are accepted by a further tool which carries the chips in a linear movement over the substrate and deposits them there. Pick plane and substrate plane run parallel, but at different levels. It thereby becomes possible for the wafer table to be able to be driven under the substrate table, which is evidently advantageous particularly in the case of large wafers because this means that the total basic area of the machine can be kept small. However, in this case the chip is evidently always turned by the transfer operation, so that it is deposited onto the substrate by its structure side rather than by its bearing side (flip-chip application). Moreover, the rotatable pick tool requires a relatively large external diameter in order to overcome the height difference between the pick plane and the delivery plane, which is not advantageous either with regard to the kinematics or for space reasons.

Therefore, it is an object of the invention to provide a method of the type mentioned in the introduction in which the height difference between the plane of the supply station and a provision plane located at a higher level can be overcome with a smaller space requirement and in kinematically more advantageous fashion and in which, moreover, components can also be deposited onto the substrate again by the same bearing side (non-flip application), with the possibility of obtaining a highest possible throughput with an improved depositing accuracy. Moreover, the intention is to afford the possibility of picking at room temperature, but of also being able to effect hot positioning under certain circumstances. Moreover, the intention is for it to be possible to use the same method and respectively the same apparatus to conduct both flip-chip and non-flip applications, in order to considerably broaden the range of use with low extra costs. The intention is for the position of the chip to be able to be captured as optimally as possible by means of the corresponding optical image recognition devices at different locations. Finally, the apparatus is intended also to be constructed as compactly as possible and to have a smallest possible machine layout plan. This object is achieved from a method standpoint by means of a method having the features in claim 1. From an apparatus standpoint, the object is achieved by means of an apparatus having the features in claim 11.

If the path of the component between the plane of the supply station and the provision plane is covered in at least two separate, ascending curve movements, space can evidently be saved relative to the layout plan. In this case, the primary tool covers a first curve movement with the component, transfers the component, in a transfer position, to at least one pivoting tool, which covers a second curve movement as far as the provision plane. In this case, the curve radii are significantly smaller than if the travel of the component has to be covered by a single rotary tool. Moreover, significantly smaller masses have to be accelerated and decelerated, which reduces the energy outlay and enables faster movement sequences. Given correspondingly large height differences, a plurality of pivoting tools could, of course, be connected in series, with the result that the travel would be covered in more than two separate pivoting movements. The at least one pivoting tool must evidently be arranged in the operative region of the primary tool.

For a flip-chip application, it is particularly advantageous if the primary tool transfers the component to an intermediate pivoting tool, which acquires the component at the bearing side and, after a pivoting movement, transfers it to a final pivoting tool, which acquires the component at the structure side again and pivots it into the provision plane, where it is transferred to the secondary tool, wherein it is finally deposited onto the substrate by the structure side. In this case, the intermediate pivoting tool evidently performs the function of transferring the component to the final pivoting tool in such a way that it can be acquired at the structure side. It is only under this condition that the component is also finally deposited again by the structure side by means of the secondary tool if repeated turning is intended to be avoided.

By contrast, in the case of non-flip applications, it is expedient if the primary tool transfers the component directly to a final pivoting tool, which acquires the component at the bearing side and pivots it into the provision plane, where it is transferred to the secondary tool, wherein it is finally deposited onto the substrate once again by the same bearing side. It is evident that the transfer of the component from the primary tool to the final pivoting tool thus already has the effect that it can be acquired by the secondary tool at the structure side and thus also be deposited once again by the bearing side.

Particularly diverse possibilities for use arise, however, if the components are transferred to the final pivoting tool via the intermediate pivoting tool in a first operating mode and directly in a second operating mode, wherein the pivoting movement of the primary tool in the first and in the second operating mode, respectively, proceeding from the pick-up at the supply station, preferably proceeds on separate movement sections, e.g. sectors. Flip-chip applications and non-flip applications can thus optionally be conducted. The performance of the pivoting movement of the primary tool on separate movement sections in a manner dependent on the selected operating mode enables an optimum arrangement of the intermediate pivoting tool or the final pivoting tool or a geometrically optimum curve course. Instead of partial circle arc movements, however, other curve movements, such as e.g. a cycloid or a spiral, could also be conducted depending on the choice of gear mechanisms used. The curvature proceeding in opposite senses enables short paths and enables the travel between the plane of the supply station and the provision plane to be negotiated as directly as possible. The movement of the secondary tool from the acceptance of the component as far as over the substrate advantageously proceeds linearly. However, a curved movement would be conceivable in this case, too.

A particularly advantageous machine arrangement and movement implementation arises if the transport of the component from the supply station as far as onto the substrate essentially proceeds on an approximately vertical transport plane. All drive elements and auxiliary devices can therefore evidently be arranged along said plane. This also significantly simplifies the visual observation of the work sequence and the maintenance of the machine. Further advantages can be achieved if the actual position (position and angle) of the component on the supply station prior to the pick-up is determined by means of a first image recognition device, and/or if the actual position of the component in the provision plane prior to the transport to the substrate is determined by means of a second image recognition device, and/or if the actual position of the substrate is determined by means of a third image recognition device, wherein deviations between the actual values determined and a predetermined desired position of the component are corrected preferably during transport. The image recognition devices may be CCD cameras, for example. With a total of only three cameras of this type it is possible here to achieve a very high precision or the possibility of optimal correction. Depending on the application, however, it would also be conceivable to measure for example only the actual position of the component in the provision plane.

With regard to the possibility of the different operating modes mentioned in the introduction, it is expedient if the actual position of the component in the provision plane is determined by the second image recognition device from below upward toward the component held at the secondary tool in the first operating mode and from above downward toward the component held at the final pivoting tool in the second operating mode. This ensures that the component can always be measured at the structure side independently of the operating mode in the provision plane.

The actual position is advantageously determined by means of a respective one of the image recognition devices whenever the primary tool or the secondary tool or the final pivoting tool clears the image field of the actual position to be determined. Transport movement and image recognition thus proceed in such a way that they do not impede one another.

Further advantages can be achieved if the first image recognition device is arranged in such a way that the image field assigned to it is captured from within the pivoting range of the primary tool in both operating modes. It is likewise possible for the second image recognition device, for the second operating mode, to be arranged in such a way that the image field assigned to it is captured from within the pivoting range of the final pivoting tool. In this case, the first and the second image recognition device or the optical axes thereof at the exit opening may be arranged on mutually offset vertical axes. A different arrangement would also be possible, however, for example if the axes of rotation of the primary tool and of the final pivoting tool lie on a common vertical.

The third image recognition device for recognizing the actual position of the substrate may be arranged at a preferably linearly displaceable slide. This enables the camera to be driven into an observation position independently of the respective position of the secondary tool. This simplifies the construction of the substrate feeding. This is because in the case of substrates with a matrix-like arrangement of depositing positions, the substrates only have to be displaced in one direction (x), while the other direction (y) can be attained by the image recognition device that can be moved in this spatial direction and the secondary tool that can likewise be moved in this spatial direction. In addition, this evidently increases the flexibility of the sequences and thus improves the throughput since the measurement can be effected in a manner decoupled from the position of the secondary tool and processes can thus be parallelized. For high-precision applications, however, it may also be expedient for the third image recognition device to be arranged directly at the slide of the secondary tool.

Further advantages can be achieved if the placement station is embodied as a transport station for the preferably linear passage of a plurality of substrates. In this case, clamping devices, conveyor belts or the like which are known per se may be used as transport means.

A wafer cassette may be arranged alongside the supply station and can be moved, for the purpose of loading wafer frames onto the supply station, into different loading positions in which the supply station and the wafer cassette are arranged at least partly on the same plane, wherein the wafer cassette can be moved into a rest position in which the supply station, for processing a loaded wafer frame, can be displaced at least partly in the horizontal working plane over the wafer cassette. The wafer cassette can thus evidently be arranged in a highly space-saving manner without its function being impaired during the loading of the working station.

Finally, further advantages may additionally be achieved if one or a plurality of intermediate placement stations at which a component can be placed temporarily prior to the transfer to the secondary tool are arranged in the pivoting range of the primary tool and/or of the final pivoting tool. It is evidently thus possible for individual components to be temporarily removed from the working process and stored intermediately in order to be processed further again at a later point in time. Specifically, with regard to present-day quality requirements in manufacturing, it is necessary in some instances for example to differentiate chips in terms of quality. In order to obtain a highest possible yield, it may be necessary for only high-quality chips to be deposited onto high-quality substrate positions, with poorer-quality chips being able to be used on poorer-quality substrate positions. The intermediate placement station enables qualitative control of the placement process in a particularly simple manner.

Various configurations of the invention are evidently conceivable without departing from the subject matter of the scope of protection. Thus, e.g. two separate final pivoting tools could accept components from a common primary tool and transfer them to two separate secondary tools.

Figure 2:
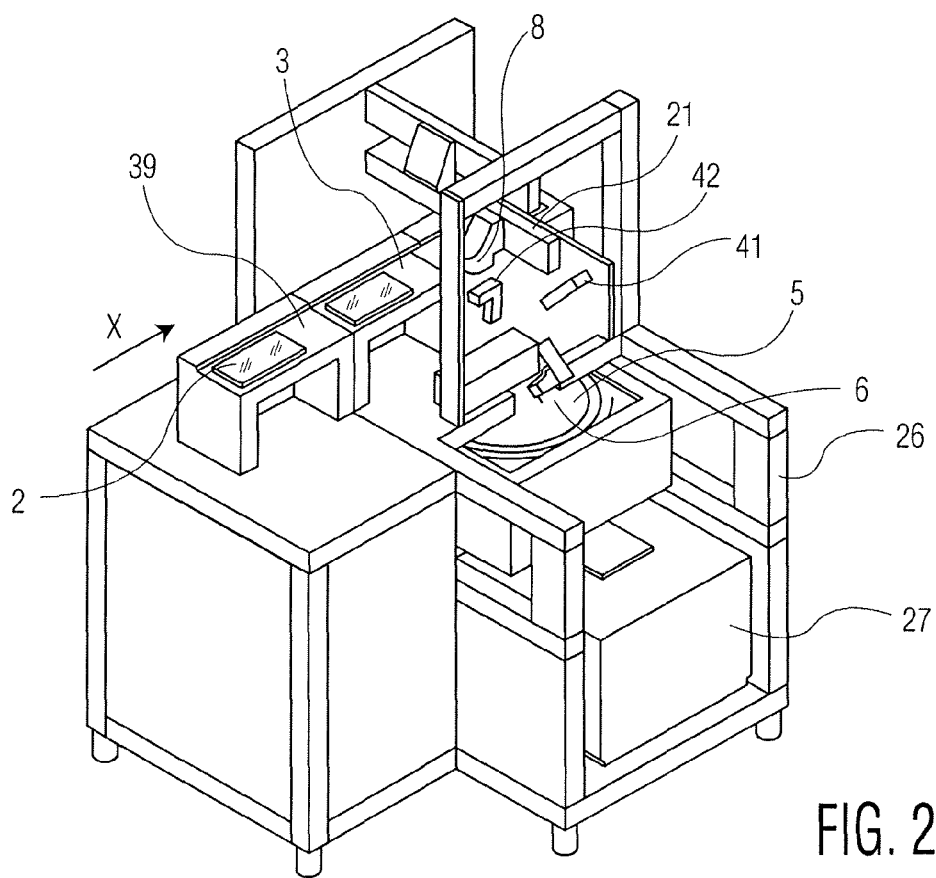
Figure 3:
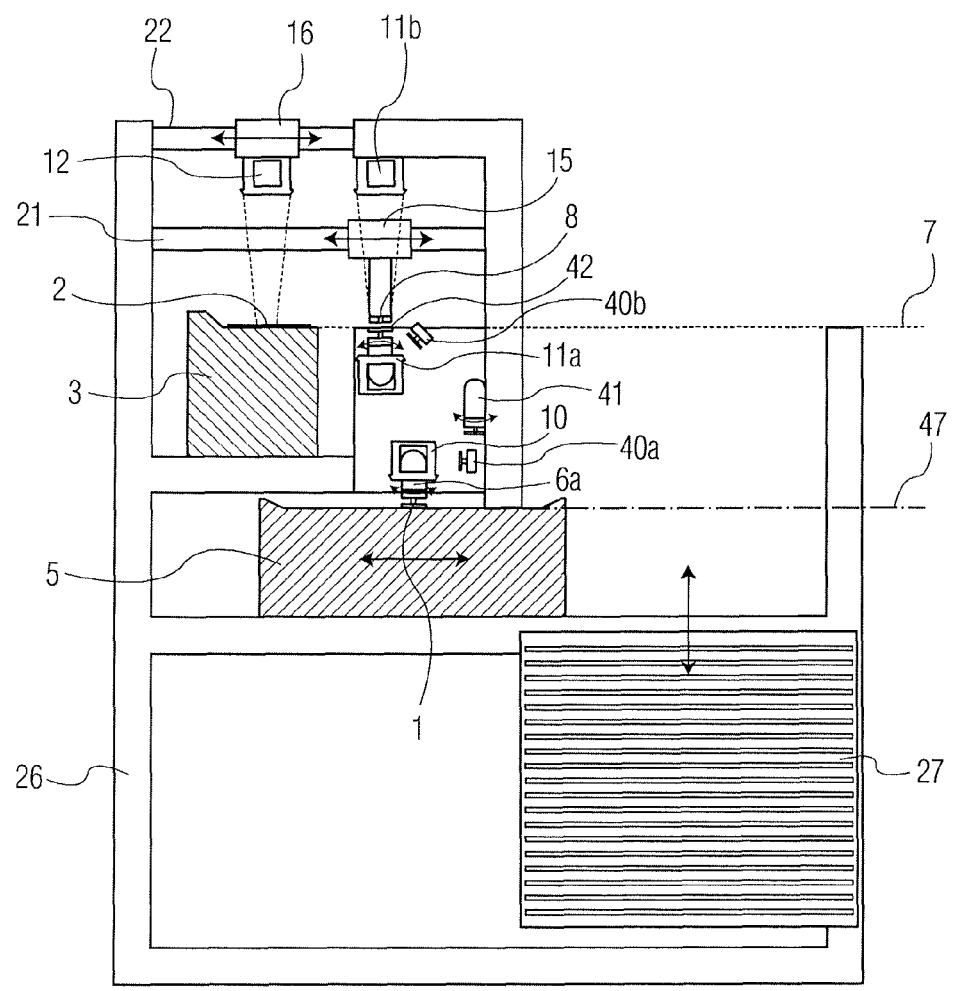
Figure 4:
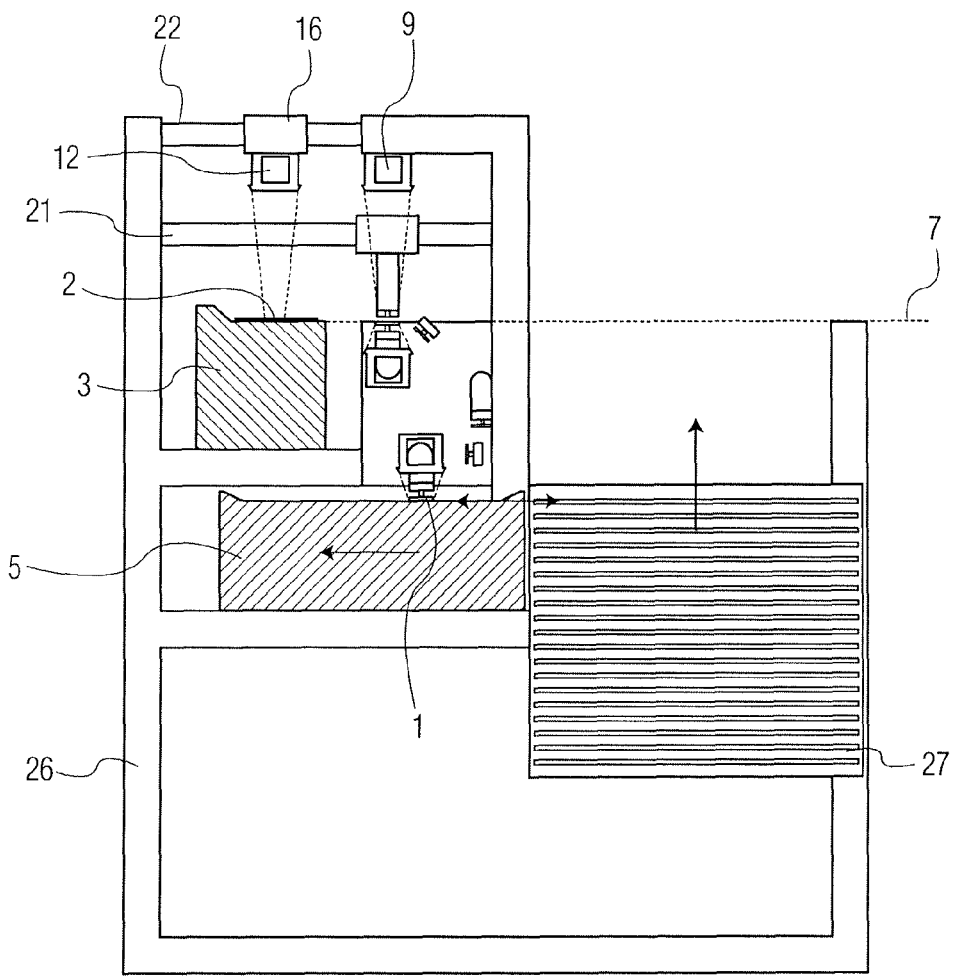
Figure 5:
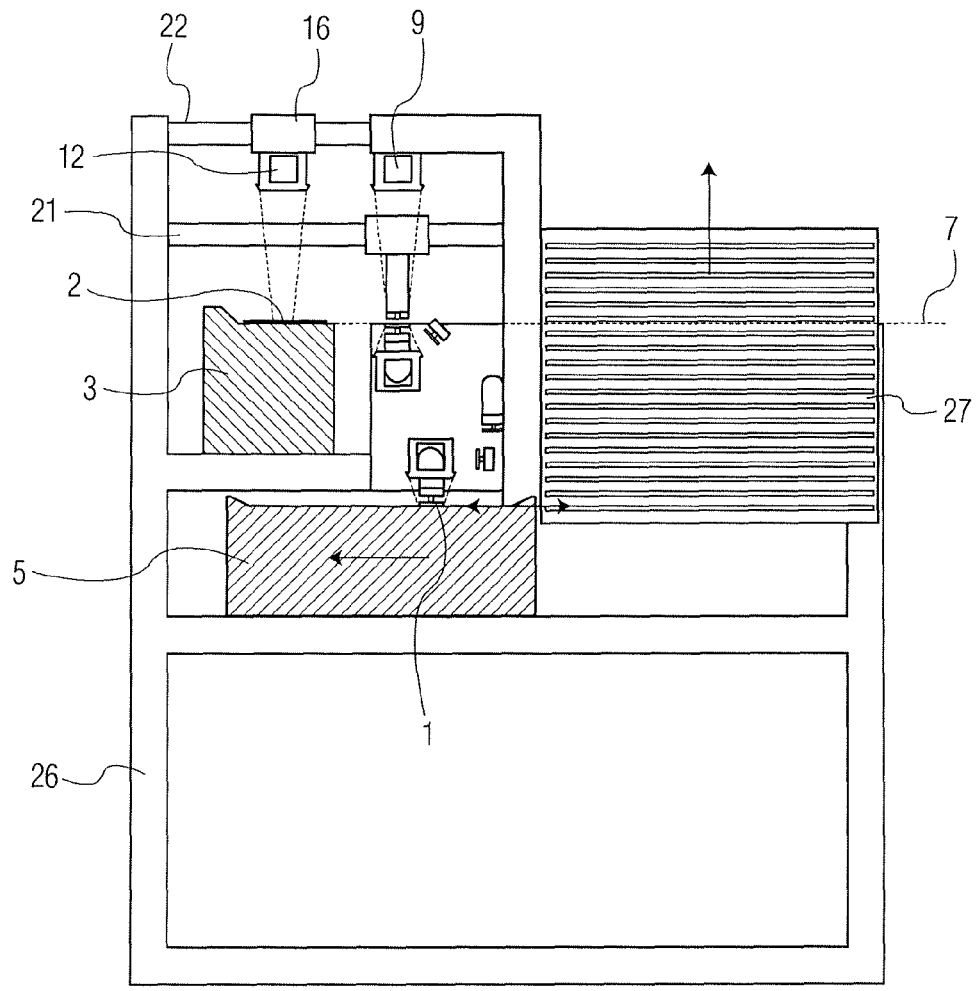
Figure 6:
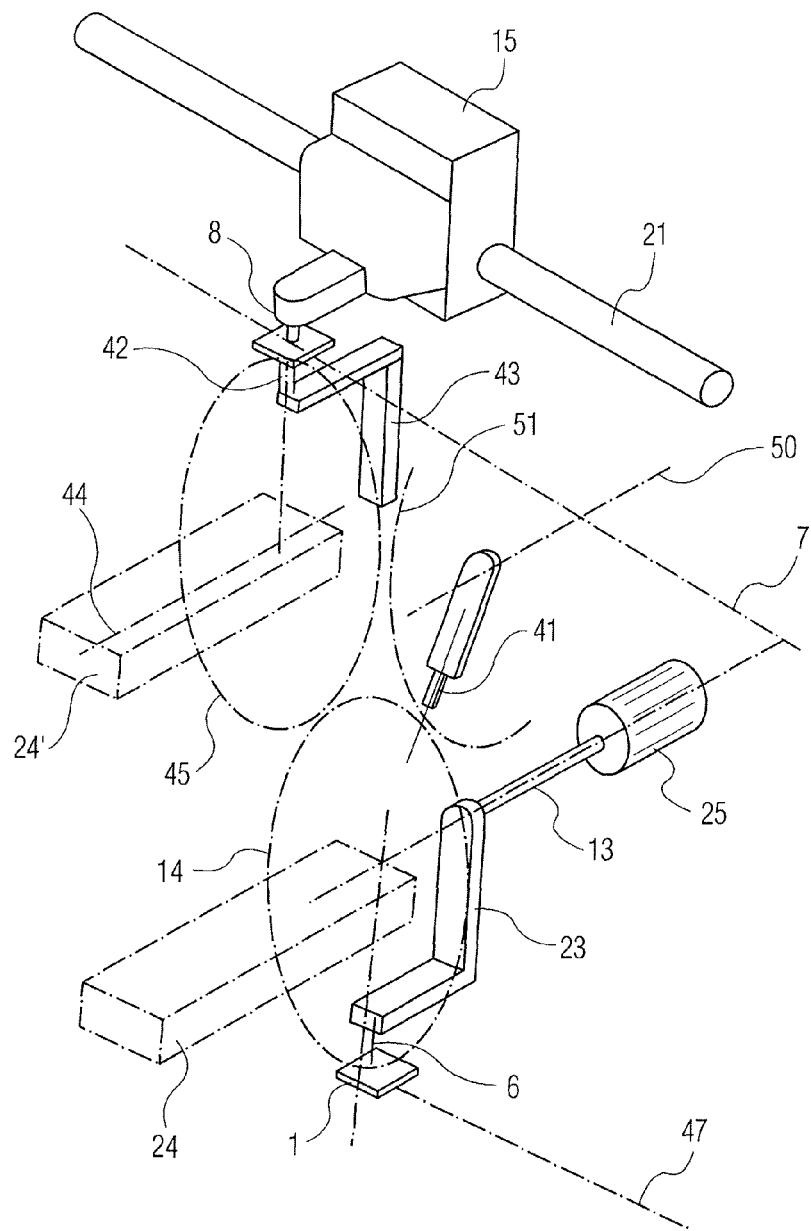
Figure 7:
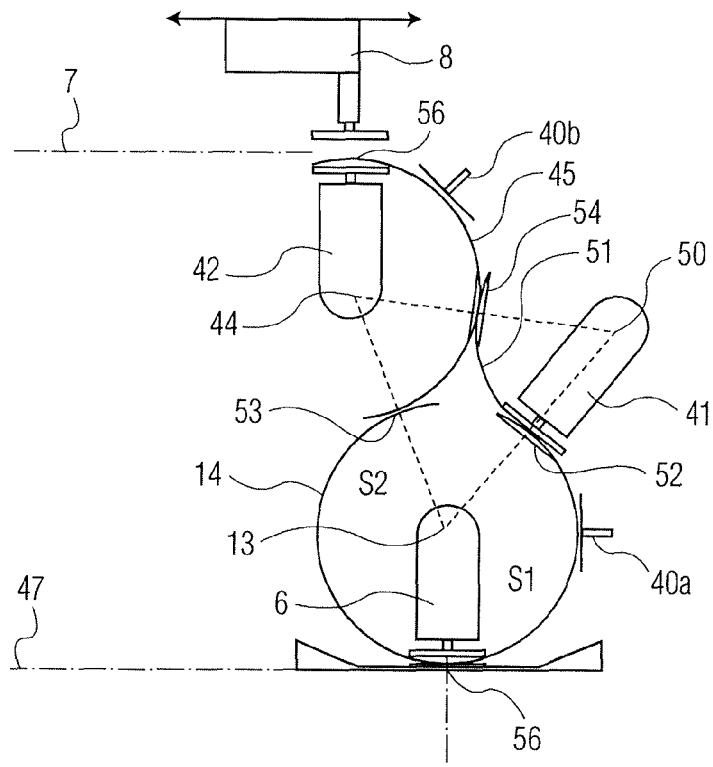
Figure 8:
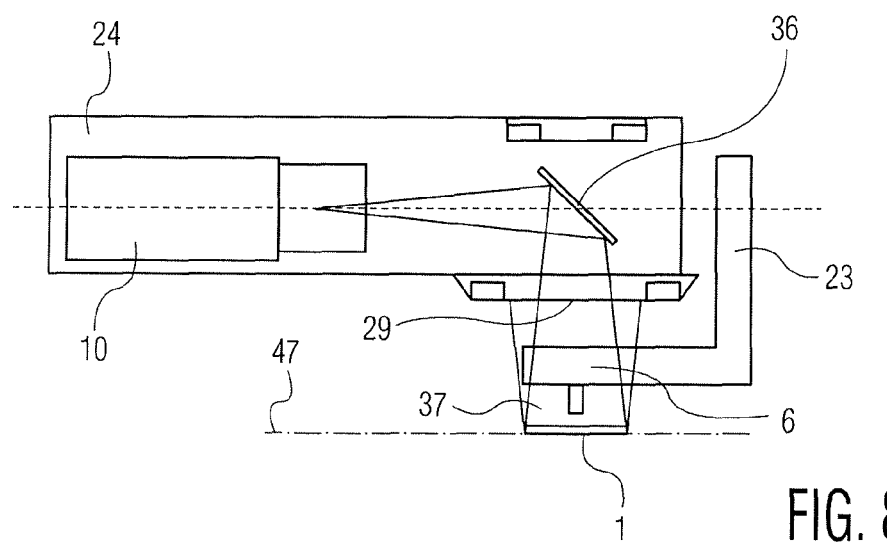
Figure 9:
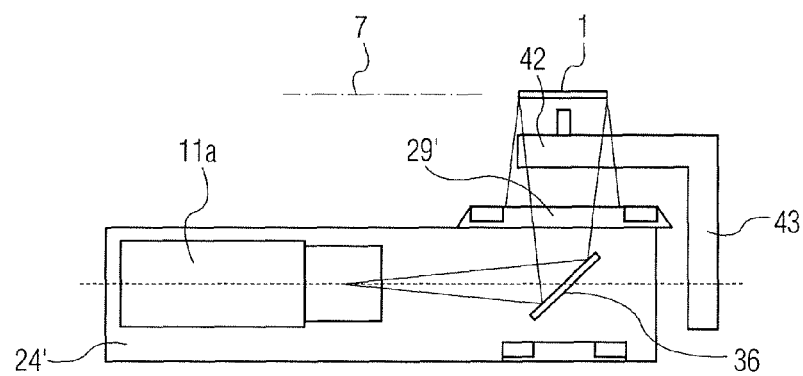
Figure 10:
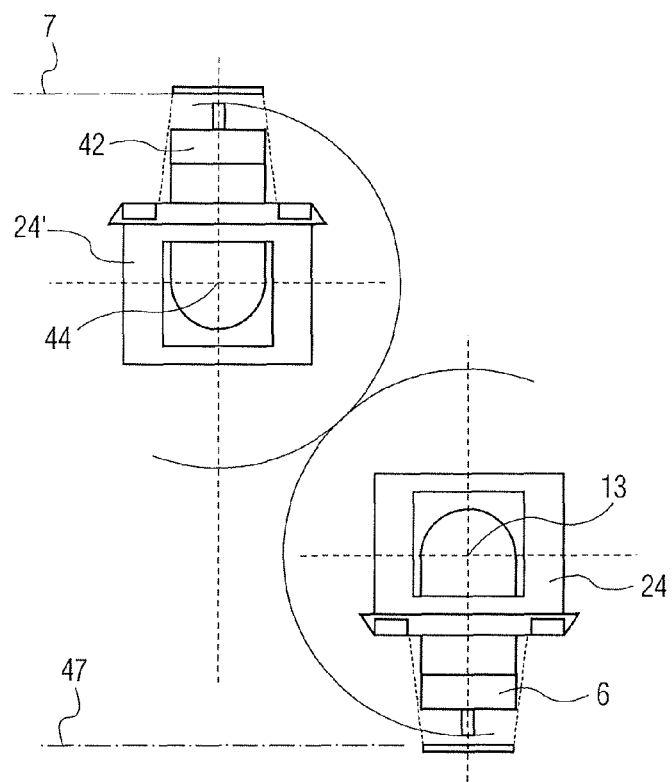

Further individual features and advantages of the invention emerge from the following description of an exemplary embodiment and from the drawings, in which:

FIG. 1 shows a simplified illustration of a subdivided wafer with a semiconductor chip illustrated in enlarged fashion, FIG. 2 shows a perspective overall illustration of an apparatus, FIG. 3 shows a greatly simplified side illustration of the apparatus in accordance with FIG. 2 with a wafer cassette in a rest position, FIG. 4 shows the apparatus in accordance with FIG. 3 with the wafer cassette in the bottommost feed position, FIG. 5 shows the apparatus in accordance with FIG. 3 with the wafer cassette in the topmost feed position, FIG. 6 shows a perspective illustration of a primary tool, an intermediate pivoting tool and a final pivoting tool and a secondary tool, FIG. 7 shows a schematic illustration of the curve course of the tools at the apparatus in accordance with FIG. 6, FIG. 8 shows a side illustration of the first image recognition device at the primary tool, FIG. 9 shows a side illustration of the second image recognition device at the final pivoting tool, FIG. 10 shows a front view of the two image recognition devices in accordance with FIGS. 8 and 9, FIGS. 11a-11e show different sequences of a working procedure without turning of the component, and FIGS. 12a-12e show different sequences of a working procedure with turning of the component.

FIG. 1 illustrates an arrangement known per se in a highly simplified manner, in which arrangement an already subdivided semiconductor wafer 18 is adhesively bonded onto a wafer film 19, which, for its part, is clamped in a wafer frame 20. The semiconductor chips 1 have already been singulated by means of the sawing lines, which is indicated by the intercepting lines. Each chip 1 has a bearing side 4, by which it adheres on the wafer film 19 prior to detachment. A semiconductor structure is applied on the opposite side to the bearing side 4, for which reason it is referred to hereinafter as the structure side 17. If the electronic component is not a semiconductor chip, the structure side in each case simply corresponds to the top side of the component. The singulation of the chips by sawing and the detachment procedure from the wafer film with the aid of needles and other auxiliary means are already sufficiently known to the person skilled in the art.

The essential functional units of an apparatus will firstly be described with reference to FIG. 2. A supply station 5 is arranged on a machine frame, said supply station being embodied in the present case as a wafer table for receiving prepared wafer frames in accordance with FIG. 1. The supply station can be displaced on a horizontal plane in two spatial axes, such that each individual chip can be driven into a detachment position. Further wafer frames can be subsequently provided as required from a wafer cassette 27, which here has been lowered into the rest position. The placement station 3, to which the components have to be transported from the supply station, is in this case embodied as a feed system 39, on which substrates 2 can be fed cyclically in arrow direction x.

The individual chips are lifted off from the supply station 5 by a primary tool 6 and pivoted up and then transferred alternatively to an intermediate pivoting tool 41 or directly to a final pivoting tool 42. The latter transfers the chip to the secondary tool 8, which can be displaced along a slide guide 21 to above the placement station 3.

Further details of the apparatus are evident from FIG. 3. For transporting the individual chips 1, it is necessary firstly to overcome a height difference between the plane 47 of the supply station and the provision plane 7, which practically coincides with the plane of the placement station 3 with the substrates 2. Said height difference is covered, in a manner described in even more detail below, by at least two pivoting movements of the primary tool 6 and the final pivoting tool 42 and, if appropriate, also by an intervening pivoting movement of the intermediate pivoting tool 41. The secondary tool 8 is fixed to a slide 15, which can be displaced linearly on a guide rail 21. At the secondary tool, correction movements are possible in the x and y axes and about an axis of rotation prior to the depositing of the component if this is necessary on account of the determination of the actual position.

The various working tools are provided with receiving tools for fixedly holding a component e.g. by means of vacuum. Said receiving tools can preferably additionally perform at least one further movement in their longitudinal axis and/or about their longitudinal axis.

An intermediate placement station 40a and 40b is in each case arranged in the pivoting range of the primary tool 6 and the final pivoting tool 42, respectively. As mentioned in the introduction, these intermediate stations serve for temporarily positioning a chip in a waiting position in order to transport it further at a later point in time. Similarly to the working tools for transporting the components, the intermediate placement stations are also provided with receiving tools.

Various cameras are arranged on the apparatus for monitoring and correction of various actual positions. A first camera 10 determines the actual position of a chip 1 at the supply station 5 prior to lift-off. A second lower camera 11a recognizes the position of a chip in the case where transfer to the secondary tool 8 has already taken place. By contrast, a second upper camera 11b recognizes the position of a chip at the final pivoting tool 42 prior to transfer to the secondary tool 8. It is evident that one of the two second cameras 11a or 11b is alternatively activated, depending on whether the secondary tool acquires the chip at the bearing side or at the structure side. Finally, a third camera 12 can recognize the actual position of the substrate 2 on the placement station 3. Said third camera 12 is arranged at a slide 16, which can be displaced along a guide rail 22. Further details concerning these components emerge from FIGS. 8 to 10.

Since the placement station 3 and the supply station 5 lie on different planes, the supply station 5, that is to say the wafer table, can evidently move under the placement station, that is to say under the feed system, with regard to its range of movement, whereby the layout plan of the machine frame 26 can be kept very small. The supply station 5 must be horizontally displaceable in two spatial axes since each individual chip to be lifted off is in each case to be moved exactly under the lifting-off primary tool 6. Controls of this type are already known to the person skilled in the art.

FIGS. 3 to 5 reveal further details concerning the displaceability of the supply station 5 in combination with the wafer cassette 27. The wafer cassette 27 has various insertion compartments in a manner known per se, each compartment containing a prepared wafer frame with a subdivided wafer (in accordance with FIG. 1). The wafer cassette can be moved vertically and a removal mechanism (not specifically illustrated here) can remove a wafer frame from each tier and transfer it to the supply station 5. In accordance with FIG. 3, the wafer cassette 27 has been lowered below the level of the supply station. In this position, the supply station 5, which can be displaced in two spatial axes, can be moved both under the placement station 3 and over the wafer cassette 27, whereby the machine layout plan can evidently be kept very small.

In accordance with FIG. 4, the wafer cassette 27 is in the bottommost unloading position, in which a wafer frame can be removed from the topmost tier. Subsequently, each time a wafer frame has been emptied by picking, said wafer frame is pushed back into the corresponding empty tier and a new wafer frame is removed from the next tier until the last tier is reached. In this case, the wafer cassette 27 is situated in the topmost removal position, which is illustrated in FIG. 5. It goes without saying that the wafer cassette 27 is lowered into the rest position in accordance with FIG. 3 again after each loading or unloading procedure.

FIG. 6 shows further details of the entire transport apparatus. In this case, the primary tool 6 is arranged at the end and on the outer side of an L-shaped rotary arm 23. The rotary arm rotates about a horizontal axis 13 and can be driven rotationally by means of a motor 25. In this case, the primary tool describes a rotational circle or partial circle 14, the motor 25 enabling actuation in both directions of rotation. A camera housing 24 with an objective output, which will be described below, is arranged within the rotational circle 14. In the same or a similar manner, the final pivoting tool 42 on an L-shaped rotary arm 43 can be pivoted about an axis 44 on a rotational circle 45. Here, too, a camera housing 24' projects inside the rotational circle 45, but with an objective output directed upward.

Finally, an intermediate pivoting tool 41 is additionally arranged in, the operative region of the primary tool 6 and the final pivoting tool 42. Said intermediate pivoting tool rotates about an axis 50 and describes a rotational circle 51 in this case. Since no camera housing has to be mounted within the rotational circle here, the arrangement on an L-shaped rotary arm is not necessary. The provision plane 7 practically forms a horizontal tangent with respect to the rotational circle 45. The guide rail 21 for the slide 15 of the secondary tool 8 extends above the provision plane 7. In the position illustrated in FIG. 6, the secondary tool 8 has just accepted a semiconductor chip from the final pivoting tool 42 and is transporting said chip in the direction of the placement station. All the tools are provided with receiving tools in a manner known per se, the pneumatic lines and control apparatuses required for operating said tools not being illustrated.

FIG. 7 shows the geometrical relationship between the tools illustrated in FIG. 6, and in particular the curve course of a component 1 between the plane 47 of the supply station and the provision plane 7. The axes 13, 44 and 50 of rotation of the working tools form a triangle with respect to one another, the rotational circles 14, 45 and 51 touching or approximately touching one another on the sides of the triangle and forming a first transfer position 52, a second transfer position 53 and a third transfer position 54 in the process. Proceeding from the pick-up position 55, the primary tool 6 covers a pivoting movement which leads, depending on the operating mode, via a first sector 55 as far as the first transfer position 52 or via a second sector S2 as far as the second transfer position 53. The intermediate pivoting tool 41 is either inactive or always covers a pivoting movement between the first transfer position 52 and the third transfer position 54. Depending on the operating mode, the final pivoting tool 42 covers a pivoting path between the second transfer position 53 and the placement position 56 or between the third transfer position 54 and the placement position 56. It is evidently possible, depending on the constructional conditions, for the radii of the various rotational circles to be formed differently. It would be conceivable, moreover, also to integrate additional pivoting tools, such that the travel between the two planes 7 and 47 is covered in a plurality of curve movements. The intermediate placement stations 40a, 40b arranged along the curved path could also be embodied as pivoting tools that are able to transport away a component.

The functioning and arrangement of the first camera 10 and the lower second camera 11a are described below with reference to FIGS. 8 to 10. The cameras are respectively arranged in an elongate camera housing 24 and 24' projecting into the rotational circle of the primary tool 6 and the final pivoting tool 42, respectively. In the case of the first camera 10, the output opening 29 is directed downward toward the plane 47 of the supply station. By contrast, in the case of the lower second camera 11a, the output opening 29' is directed upward toward the provision plane. The image deflection is effected in each case at a deflection mirror 36. Depending on the working position of the primary tool 6 arranged on the rotary arm 23 and of the final pivoting tool 42 arranged on the rotary arm 43, the image region 37 is in each case completely cleared for the corresponding camera.

It is evident from FIG. 10, in particular, that, in a manner corresponding to the axes 13 and 44 of rotation, the respective optical axes in the region of the output openings of the cameras are also arranged laterally offset with respect to one another. In specific cases, however, it would also be conceivable for the axes 13 and 44 of rotation and therefore also the optical axis in the region of the output opening to be arranged on a common vertical axis.

The placement procedure for a semiconductor chip is described below with reference to FIGS. 11a to 11e, in the case of which the chip is placed onto the substrate by the same bearing side by which it previously adhered on the wafer film (non-flip application). In accordance with FIG. 11a, the rotary arm 23 is in a vertical position in which the primary tool 6 acquires a semiconductor chip from the supply station 5. At the same time, the final pivoting tool 42 transfers an already previously loaded chip to the secondary tool 8 in the provision plane 7.

Figure 11A:
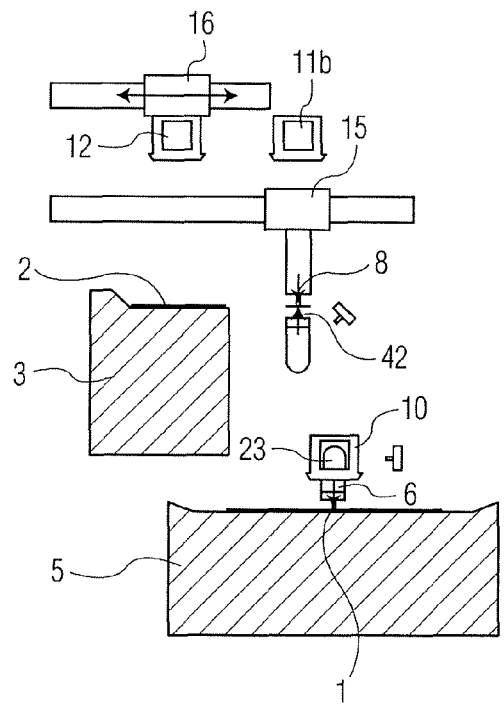
Figure 11B:
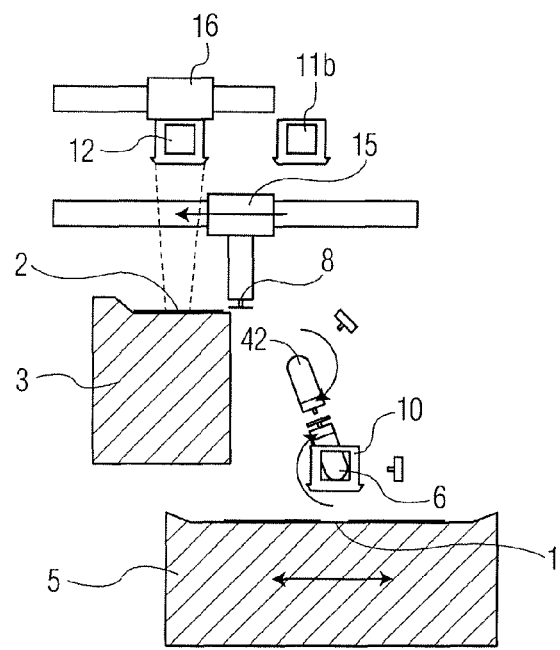

In accordance with FIG. 11b, the primary tool 6 and the final pivoting tool 42 rotate toward one another in each case in the clockwise direction, while the secondary tool 8 on the slide 15 is moved toward the placement station 3. Before the placement station is reached, the actual position of the substrate 2 is ascertained by means of the third camera 12 on the slide 16.

Figure 11C:
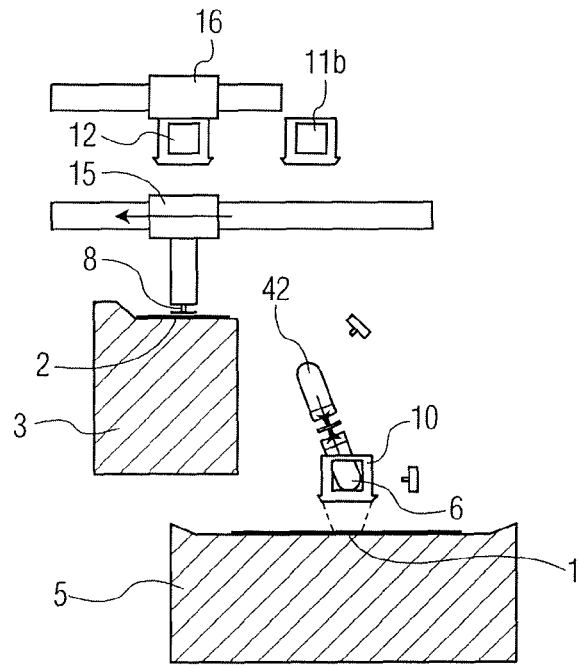

In accordance with FIG. 11c, the secondary tool 8 has reached its delivery position above the substrate 2. The primary tool 6 transfers its chip to the final pivoting tool 42 and the next chip 1 to be picked up on the supply station 5 is simultaneously measured with the aid of the first camera 10.

Figure 11D:
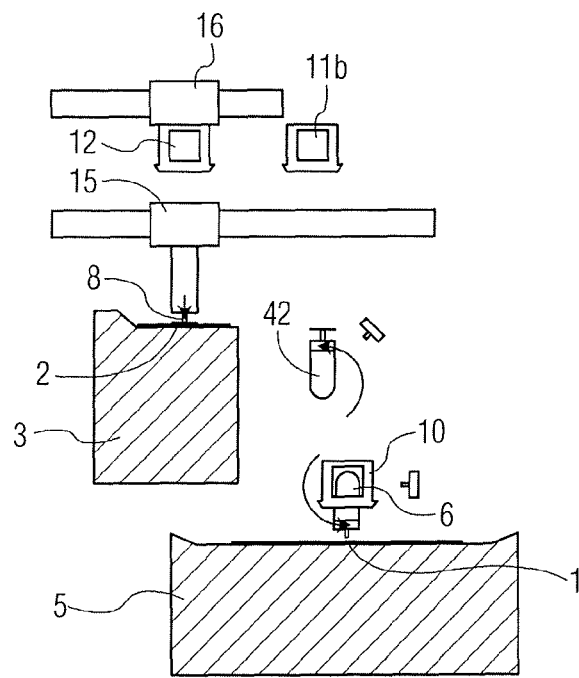

In accordance with FIG. 11d, the secondary tool 8 has deposited its chip onto the substrate 2. The primary tool 6 is returned to its pick-up position in the counterclockwise direction. The final pivoting tool 42 has likewise been pivoted back to its delivery position in the counterclockwise direction.

Figure 11E:
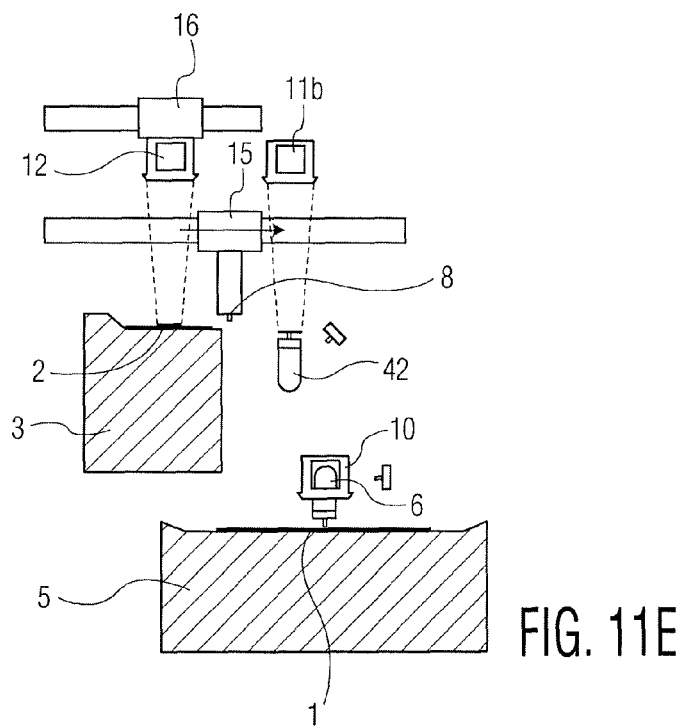

Finally, FIG. 11e shows the empty secondary tool 8 on its way back to pick up a new chip. As illustrated, in this case, in an intermediate position, it is possible to actuate both the upper second camera 11b for determining the actual position of the chip at the final pivoting tool 42 and the third camera 12 for determining the actual position of the substrate 2. As soon as the secondary tool 8 has reached its initial position, the cycle begins anew again in accordance with FIG. 11a. In FIGS. 11a to 11e, the non-required lower second camera 11a and the intermediate pivoting tool 41 have been omitted for reasons of better clarity.

If it is desired to place the chip onto the substrate by its structure side (flip-chip application), the apparatus can be driven in another operating mode. In this case, the intermediate pivoting apparatus 41 is actuated, as is evident from FIGS. 12a to 12e. In these figures, the upper second camera 11b, which is not required in this operating mode, has been omitted for reasons of better clarity.

Figure 12A:
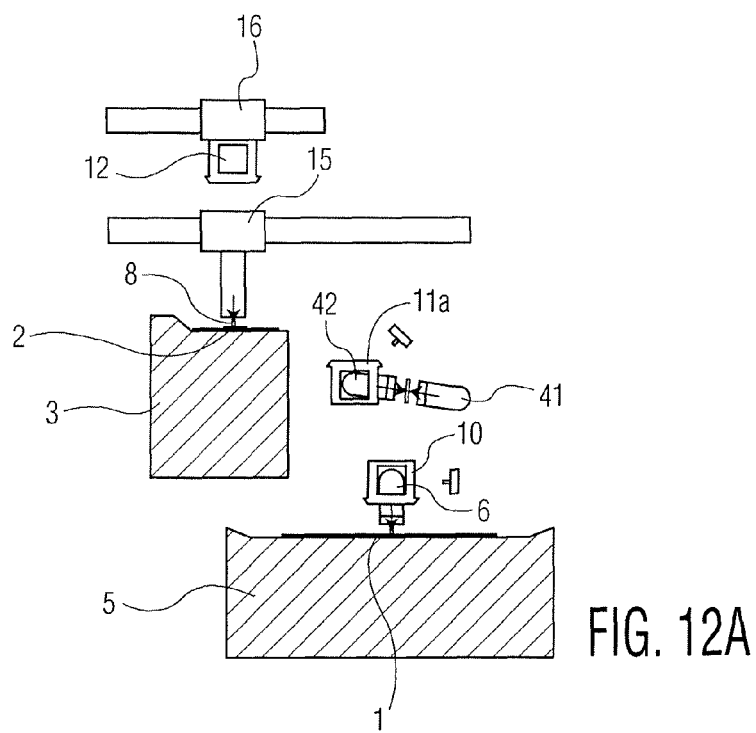

In accordance with FIG. 12a, a chip is picked up at the supply station 5 by the primary tool 6. At the same time, the secondary tool 8 deposits a chip onto the substrate 2 at the placement station 3. The final pivoting tool 42 receives a previously loaded chip from the intermediate pivoting tool 41. The various cameras are inactive.

Figure 12B:
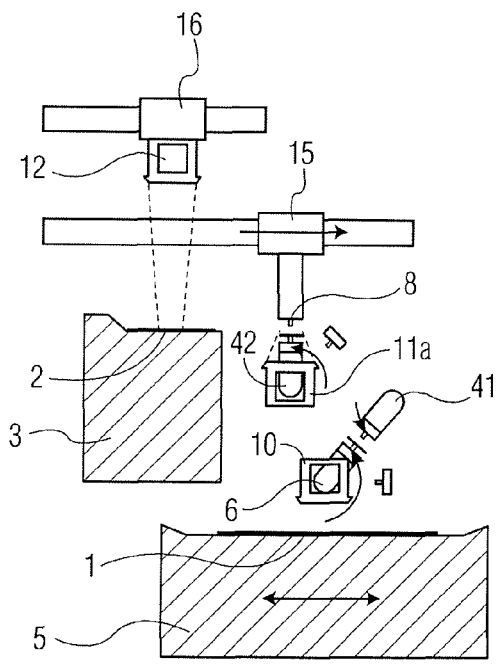

In accordance with FIG. 12b, the primary tool 6 with its picked-up chip has been pivoted in the counterclockwise direction to the first transfer position. The intermediate pivoting tool 41 has likewise been pivoted back in the counterclockwise direction in order to be able to pick up a new chip. The final pivoting tool: has pivoted the previously loaded chip back into the delivery position and the secondary tool 8 has also reached its initial position again, in which it can pick up a new chip. The actual position of the substrate 2 that is to be newly populated is measured at the placement station 3 with the aid of the third camera 12.

Figure 12C:
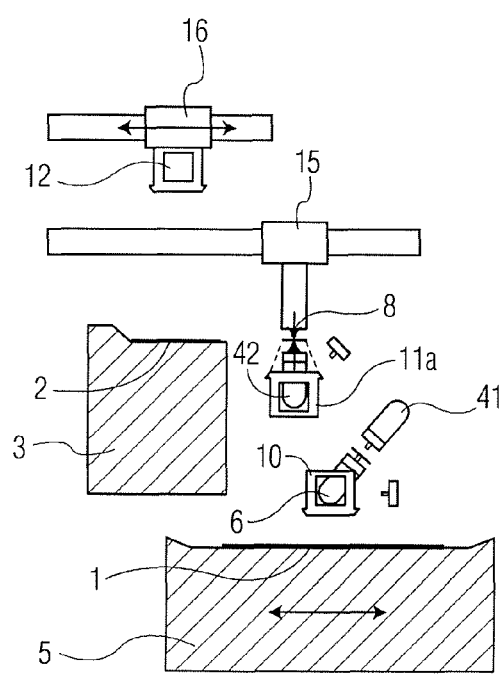
Figure 12D:
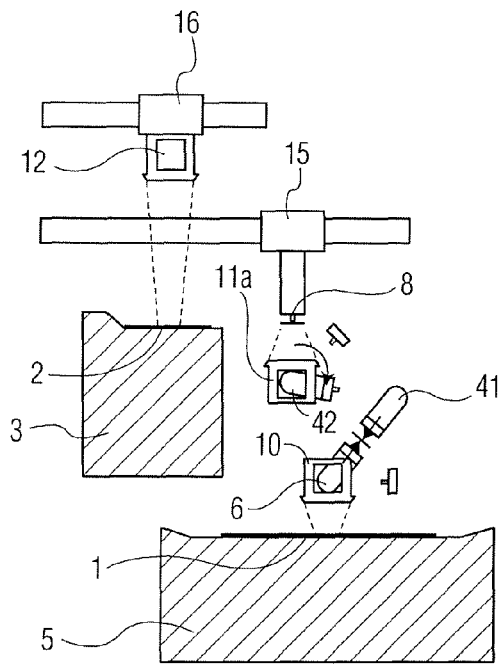
Figure 12E:
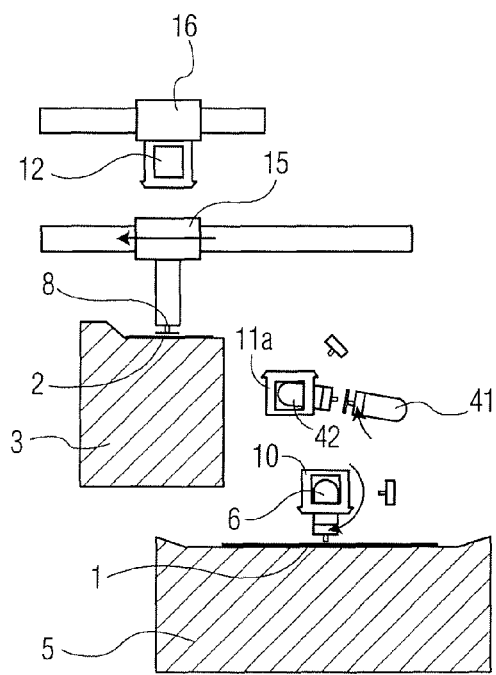

In accordance with FIG. 12c, the chip at the final pivoting tool 42 is transferred to the secondary tool 8. The primary tool 6 remains in the first transfer position. As soon as the final pivoting tool 42 pivots back again in accordance with FIG. 12d, the actual position of the chip now fixed to the secondary tool 8 can be determined by means of the lower second camera 11a. At the same time, the actual position of the next chip to be lifted off at the supply station 5 is determined by means of the first camera 10. The primary tool can transfer its previously loaded chip to the intermediate pivoting tool 41. Finally, in accordance with FIG. 12e, the primary tool 6 can pivot back to its pick-up position again. The intermediate pivoting tool 41 likewise moves its previously loaded chip into the third transfer position and the secondary tool 8 has reached its delivery position above the substrate 2. The cycle subsequently begins anew again in accordance with FIG. 12a.

The invention claimed is:

1. An apparatus for the placement of a semiconductor chip on a substrate, the apparatus comprising:
a supply station adapted to include a semiconductor wafer in a substantially horizontal position, the semiconductor wafer including the semiconductor chip;
a placement station positioned entirely above the supply station, the placement station being adapted to support the substrate; and
a transport apparatus entirely above the supply station, the transport apparatus moving the semiconductor chip from the semiconductor wafer to the substrate, the transport apparatus including (1) a pivoting pick-up tool that removes the semiconductor chip from the semiconductor wafer, the pivoting pick-up tool being arranged on a rotary arm, the rotary arm rotates about a horizontal axis to raise the semiconductor chip to a transfer position entirely above the semiconductor wafer through an ascending curved movement, (2) a placement tool that moves the semiconductor chip to the placement station and bonds the semiconductor chip on the substrate at the placement station, and (3) at least one pivoting transfer tool that transfers the semiconductor chip from the pivoting pick-up tool to the placement tool, each of the at least one pivoting transfer tool being arranged on a respective rotary arm to rotate about a respective horizontal axis to raise the semiconductor chip along a respective ascending curved movement.

2. The apparatus of claim 1 wherein the at least one pivoting transfer tool includes (a) an intermediate pivoting transfer tool arranged in an operative region of the pivoting pick-up tool, and (b) a final pivoting transfer tool arranged in an operative region of the intermediate pivoting transfer tool, wherein the semiconductor chip is acquired by the pivoting pick-up tool at a structure side and raised to the transfer position, and is acquired by the intermediate pivoting transfer tool at a bearing side and is transferred to the final pivoting transfer tool, wherein the semiconductor chip is acquired by the final pivoting transfer tool at the structure side and is pivoted such that the semiconductor chip is acquired by the placement tool and is deposited onto the substrate by the structure side.

3. The apparatus of claim 1 wherein the at least one pivoting transfer tool includes a single pivoting transfer tool, the pivoting pick-up tool holding the semiconductor chip by a first side with a second side exposed, the single pivoting transfer tool receiving the semiconductor chip from the pivoting pick-up tool and holding the semiconductor chip by the second side with the first side exposed, and the placement tool receiving the semiconductor chip from the single pivoting transfer tool and holding the semiconductor chip by the first side with the second side exposed.

4. The apparatus of claim 1 wherein the at least one pivoting transfer tool includes an intermediate pivoting transfer tool and a final pivoting transfer tool, wherein the transport apparatus is configured to transfer the semiconductor chip from the pivoting pick-up tool to the placement tool using either of (1) the final pivoting transfer tool, or (2) both of the intermediate pivoting transfer tool and the final pivoting transfer tool.

5. The apparatus of claim 4 wherein the pivoting pick-up tool can be pivoted, in a first operating mode, from a pick-up position at the supply station to the intermediate pivoting transfer tool and, in a second operating mode, from the pick-up position at the supply station to the final pivoting transfer tool.

6. The apparatus of claim 1 wherein the pivoting pick-up tool and the at least one pivoting transfer tool are pivoted in such a way that the semiconductor chip executes a curve movement composed of circle arc sections.

7. The apparatus of claim 1 wherein the placement tool is arranged at a linearly displaceable slide.

8. The apparatus of claim 1 wherein the pivoting pick-up tool, the at least one pivoting transfer tool and the placement tool are configured to be moved essentially on a common, approximately vertical transport plane.

9. The apparatus of claim 1 wherein a first image recognition device is provided for determining an actual position of the semiconductor chip on the supply station prior to pick-up, and/or a second image recognition device is provided for determining an actual position of the semiconductor chip in a provision plane prior to placement on the substrate, and/or a third image recognition device is provided for determining an actual position of the substrate, wherein deviations between the actual values determined and a predetermined desired position of the semiconductor chip can be corrected.

10. The apparatus of claim 1 wherein a first image recognition device is provided for determining an actual position of the semiconductor chip on the supply station prior to pick-up, and/or a second image recognition device is provided for determining an actual position of the semiconductor chip in a provision plane prior to placement on the substrate, and/or a third image recognition device is provided for determining an actual position of the substrate, wherein deviations between the actual values determined and a predetermined desired position of the semiconductor chip can be corrected and for determining the actual position of the semiconductor chip in the provision plane, the second image recognition device is arranged below the provision plane in a manner directed from below upward for a first operating mode and above the provision plane in a manner directed from above downward for a second operating mode.

11. The apparatus of claim 10, wherein ones of the second image recognition device are arranged at positions below and above the provision plane, which devices can be activated alternatively depending on the operating mode.

12. The apparatus as of claim 9 wherein the image recognition devices are positioned in such a way that an image field of the actual position of the semiconductor chip to be determined is completely captured in at least one operating position of the pivoting pick-up tool, the at least one pivoting transfer tool, and the placement tool.

13. The apparatus of claim 10, wherein the image recognition devices are positioned in such a way that an image field of the actual position of the semiconductor chip to be determined can be completely captured in at least one operating position of the pivoting pick-up tool, the at least one pivoting transfer tool, and the placement tool, and wherein the first image recognition device is arranged in such a way that an image field assigned to the first image recognition device is captured from within a pivoting range of the pivoting pick-up tool, and wherein the second image recognition device for the second operating mode is arranged in such a way that an image field assigned to the second image recognition device is captured from within a pivoting range of the at least one pivoting transfer tool.

14. The apparatus of claim 9 wherein the first and the second image recognition devices, or optical axes thereof, in a region of an exit opening, are arranged on mutually offset vertical axes.

15. The apparatus of claim 9 wherein the third image recognition device is arranged at a linearly displaceable slide.

16. The apparatus of claim 1 wherein the placement station is embodied as a feed system for linear passage of a plurality of substrates.

17. The apparatus of claim 1 wherein a wafer cassette with a plurality of wafers is arranged alongside the supply station to load wafers onto the supply station into different loading positions in which the supply station can be loaded with a wafer from the wafer cassette and can be unloaded, and the wafer cassette can be moved into a rest position in which the supply station, for processing a loaded wafer, can be displaced at least partly in a horizontal working plane over the wafer cassette.

18. The apparatus of claim 1 wherein one or a plurality of intermediate placement stations at which the semiconductor chip can be placed temporarily prior to transfer to the placement tool are arranged in an operative region of the pivoting pick-up tool and/or of the at least one pivoting transfer tool.

19. The apparatus of claim 1 wherein the at least one pivoting transfer tool includes a single pivoting transfer tool, and the pivoting pick-up tool is configured to pivot in one of the ascending curve movements from a pick-up position at the supply station to the transfer position where each of semiconductor chip is transferred from the pivoting pick-up tool to the single pivoting transfer tool, and wherein the single pivoting transfer tool is configured to pivot in another of the ascending curve movements from the transfer position to the placement tool where each of the semiconductor chips is transferred from the single pivoting transfer tool to the placement tool.

20. The apparatus of claim 1 wherein the at least one pivoting transfer tool includes an intermediate pivoting transfer tool and a final pivoting transfer tool, the pivoting pick-up tool being configured to pivot in one of the ascending curve movements from a pick-up position at the supply station to the transfer position where each of the semiconductor chips is transferred from the pivoting pick-up tool to the intermediate pivoting transfer tool, and wherein the intermediate pivoting transfer tool is configured to pivot in another of the ascending curve movements from the transfer position to a second transfer position where each of the semiconductor chips is transferred from the intermediate pivoting transfer tool to the final pivoting transfer tool, and wherein the final pivoting transfer tool is configured to pivot in yet another of the ascending curve movements from the second transfer position to the placement tool where each of the semiconductor chips is transferred from the final pivoting transfer tool to the placement tool.

* * * * *

UNITED STATES PATENT AND TRADEMARK OFFICE
CERTIFICATE OF CORRECTION

| | | |
|---|---|---|
| PATENT NO. | : 8,914,971 B2 | Page 1 of 1 |
| APPLICATION NO. | : 12/226194 | |
| DATED | : December 23, 2014 | |
| INVENTOR(S) | : Trinks | |

It is certified that error appears in the above-identified patent and that said Letters Patent is hereby corrected as shown below:

In the Claims

Column 12, Line 15 should read:

supply station to the transfer position where each semicon-

Signed and Sealed this
Fifth Day of May, 2015

Michelle K. Lee
*Director of the United States Patent and Trademark Office*